United States Patent
Passegger

(10) Patent No.: US 8,147,618 B2
(45) Date of Patent: Apr. 3, 2012

(54) DEVICE AND METHOD FOR LIQUID TREATING DISC-LIKE ARTICLES

(75) Inventor: Thomas Passegger, Klagenfurt (AT)

(73) Assignee: Lam Research AG, Villach (AT)

( * ) Notice: Subject to any disclaimer, the term of this patent is extended or adjusted under 35 U.S.C. 154(b) by 735 days.

(21) Appl. No.: 12/280,559

(22) PCT Filed: Feb. 7, 2007

(86) PCT No.: PCT/EP2007/051174
§ 371 (c)(1),
(2), (4) Date: Aug. 25, 2008

(87) PCT Pub. No.: WO2007/099021
PCT Pub. Date: Sep. 7, 2007

(65) Prior Publication Data
US 2009/0000645 A1    Jan. 1, 2009

(30) Foreign Application Priority Data
Feb. 28, 2006 (AT) .................................. A 337/2006

(51) Int. Cl.
*B08B 3/04* (2006.01)
(52) U.S. Cl. ............. 134/30; 134/33; 134/37; 134/95.2; 134/95.3
(58) Field of Classification Search .................. None
See application file for complete search history.

(56) References Cited

U.S. PATENT DOCUMENTS

| | | | |
|---|---|---|---|
| 6,143,081 A | 11/2000 | Shinkiri et al. | |
| 6,273,104 B1 | 8/2001 | Shinbira et al. | |
| 6,827,973 B2 * | 12/2004 | Nagashima | 427/240 |
| 2001/0000477 A1 | 4/2001 | Harada | |
| 2006/0042666 A1 * | 3/2006 | Tsujimura | 134/95.2 |

FOREIGN PATENT DOCUMENTS

| | | |
|---|---|---|
| JP | 11-330039 A | 11/1999 |
| JP | 2000-40687 A | 2/2000 |
| JP | 2002299213 A | 10/2002 |
| JP | 2003-145014 A | 5/2003 |
| JP | 2005-166957 A | 6/2005 |
| JP | 2005-166958 A | 6/2005 |
| WO | 2005/028701 A2 | 3/2005 |

OTHER PUBLICATIONS

Japanese Office Action, dated Oct. 25, 2011, in Patent Application No. 2008-556740.

* cited by examiner

*Primary Examiner* — Michael Kornakov
*Assistant Examiner* — Ryan Coleman
(74) *Attorney, Agent, or Firm* — Young & Thompson

(57) ABSTRACT

Herein disclosed is a device and a method for liquid treatment of a disc-like article comprising rotating a disc-like article, dispensing liquid onto the disc-like article when rotated, collecting liquid, which is flung off the disc-like article when rotated, providing a plate arranged parallel to the disc-like article and facing the disc-like article when rotated, and directing gas parallel to the plate across the plate.

9 Claims, 1 Drawing Sheet

DEVICE AND METHOD FOR LIQUID TREATING DISC-LIKE ARTICLES

The invention relates to a device for liquid treating a disc-like article. More particularly the invention refers to a device for fluid treating a disc-like article, which comprises a spin chuck for holding and rotating a disc-like article, dispensing means for dispensing liquid onto the disc-like article, liquid collecting means for collecting liquid, which is flung off the disc-like article when rotated and a plate arranged parallel to the disc-like article and facing the disc-like article when held by the rotating means.

The spin chuck may be a vacuum spin chuck, an edge contact only spin chuck, a Bernoulli spin chuck or any other support capable of holding and rotating a disc-like article.

The plate may be used for heating, for carrying ultrasonic transducer and thereby applying, or just for filling a gap between the disc-like article and the plate with a liquid.

A liquid dispensing means may be a liquid nozzle close to the center of the plate. Such liquid dispensing means may dispense liquid onto the disc-like article in a free flow or may supply liquid to a gap, which is built between a disk-like article (e.g. a semiconductor wafer) and the plate, and thereby totally filling the gap.

The liquid collecting means (liquid collector) often is called a "cup" even though it does not necessarily have a closed bottom. Another word often used for the liquid collector is "chamber" even though it is not closed on all sides.

With such a device with a spin chuck and a plate (facing the disc-like article) it might occur that liquid drops remain on the plate surface. The remaining liquid drops may be formed into mist when the disc-like article spins close to the plate.

An object of the invention is to avoid that such a mist adheres to the disc-like article's surface.

The invention meets the object by providing a device for liquid treatment of a disc-like article comprising, a spin chuck for holding and rotating a disc-like article, dispensing means for dispensing liquid onto the disc-like article, liquid collecting means for collecting liquid, which is flung off the disc-like article when rotated, a plate arranged parallel to the disc-like article and facing the disc-like article when held by the rotating means, and gas-guide means for directing gas parallel to the plate across the plate.

Preferably the gas-guide means comprise an exhaust for collecting gas and a gas source for providing gas wherein exhaust and gas source are arranged opposite each other with respect to a symmetric plane, which is perpendicular to the plane of the disc-like article when treated. The easiest solution for a gas source are openings to the ambient opposite of the exhaust when the exhaust is connected to a vacuum source. In this case the provided gas is ambient air. However, an additional gas-supply such as nitrogen-supply may be connected to the device. If the gas source comprises pressurized gas (e.g. nitrogen) the exhaust is not necessarily connected to a vacuum source.

The gas-guide means may comprise additional baffles for directing gas across the disc-like article parallel to its surface.

In a preferred embodiment the gas-guide means comprises an exhaust chamber and a gas source chamber. The exhaust chamber has the shape of a first section of a ring chamber. The gas source chamber has the shape of a second section of a ring chamber.

Preferably both sections of a ring chamber are connected to the area between the plate and the disc-like article via a slot shaped annular opening.

Advantageously the first section of a ring chamber and the second section of a ring chamber are member of the same ring chamber. The leads to an easy smooth gas flow across the plate with little turbulences.

If the first section and the second section are separated from each other by a radial wall the gas is forced to flow across the plate and no bypass the ring chamber itself is possible.

In another embodiment a splash guard is provided for directing liquid, which is flung off the disc-like article when rotated, into an annular duct.

Yet another embodiment of the device according to the invention further comprising distance changing means for altering the distance between the plate and the disc-like article. This enables the disc-like article to be treated in close proximity to the plate (0.5-3 mm) with liquid and increasing the distance from disc-like article to the plate up to a higher range of 2-5 cm. This increased distance is used e.g. for drying the disc-like article. Thereby the gas flow across the plate separates the possibly wet plate from the disc-like article by an intermediate gas layer so that liquid, which adheres to the plate, is impossibly transferred onto the disc-like article's surface.

Another aspect of the invention is a method for liquid treatment of a disc-like article comprising rotating a disc-like article comprising rotating a disc-like article, dispensing liquid onto the disc-like article when rotated, collecting liquid, which is flung off the disc-like article when rotated, providing a plate arranged parallel to the disc-like article and facing the disc-like article when rotated, and directing gas parallel to the plate across the plate. Such a gas flow across the disc-like article helps to spoil turbulences which are generated when a disc-like article is rotated against a non-rotating plate.

Preferably the disc-like article is held in a distance of at least 5 mm when the gas flows parallel to the plate across the plate.

It is preferred that the disc-like article rotates at a speed of at least 10 rpm at least part of the time when gas flows across the plate. However, disc-like article might not rotate when gas flows across the plate.

Further details and advantages of the invention can be realized from the detailed description of a preferred embodiment.

Figure 1:
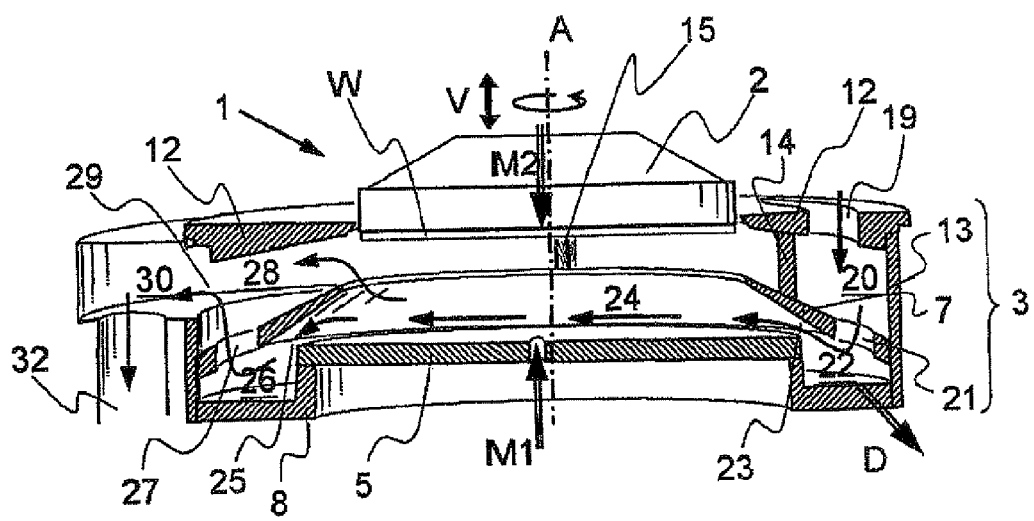
FIG. 1 shows a schematic cross sectional view of a first embodiment of the invention.
Figure 2:
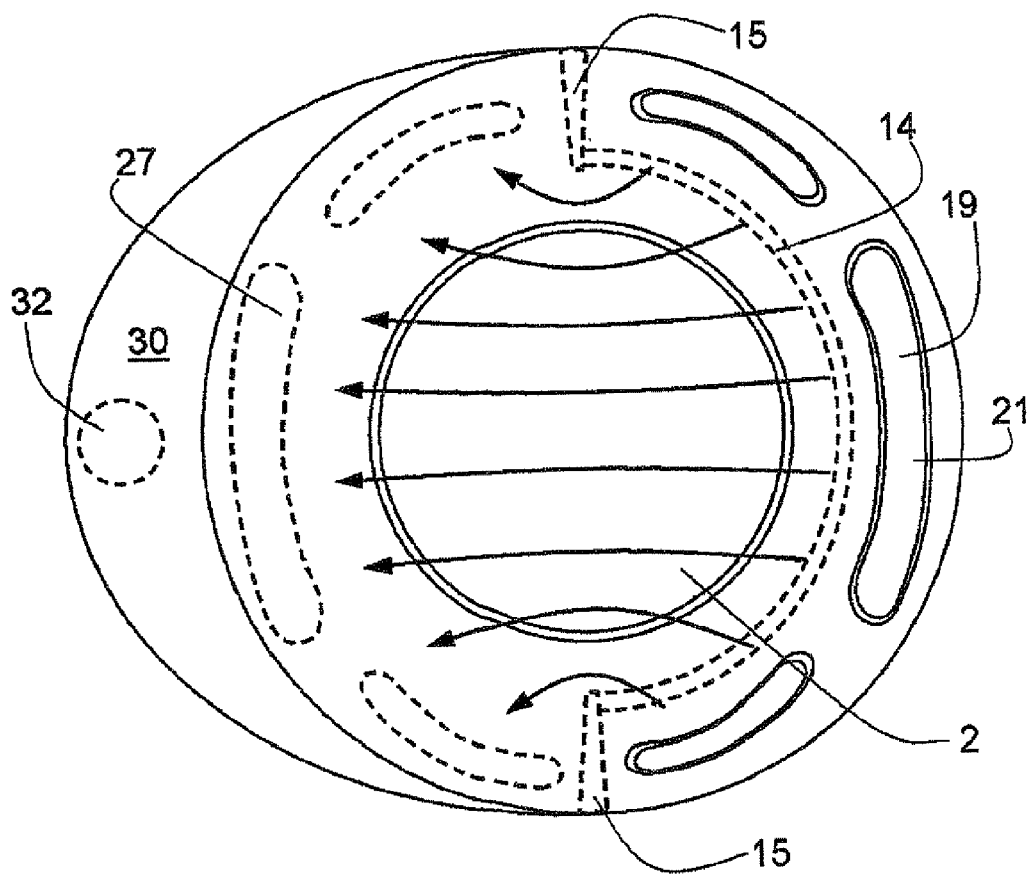
FIG. 2 shows a schematic top view of the first embodiment of the invention.

FIG. 1 and FIG. 2 show the device 1 for liquid treatment a disc-like article W according to a preferred embodiment of the invention. The device 1 comprises a spin chuck 2 and a process bowl 3. The bowl 3 comprises a bottom plate 5, a ring-shaped duct 8, an outer side-wall 13, a ring-shaped top cover 12, a baffle 14, two vertical separators 15, and a splash guard 7. The bowl 3 is connected to the spin chuck 2 via a lifting mechanism (not shown) concentric to the common axis A.

The edge of the bottom plate 5 is tightly connected with the inner upwardly projecting cylindrical sidewall of the ring-shaped duct 8. The outer diameter of the plate 5 is at least as big as the diameter of the disc-like article. The peripheral edge of the ring-shaped duct 8 is tightly connected with the bottom edge of a cylindrical outer side-wall 13.

The top edge of the cylindrical side-wall 13 is tightly connected with the peripheral edge of a ring-shaped top cover 12. The diameter of inner edge of the top cover is about 2 mm greater than the diameter of the spin chuck 2 so that the spin chuck 2 can easily pass through the opening of the top cover 12.

Within the bowl 3 a ring-shaped splash guard 7 is horizontally arranged. The splash guard 7 is tapered towards its periphery and its inner edge is about 2 mm greater than the diameter of the spin chuck 2 so that the spin chuck 2 can easily pass through the opening. The peripheral edge of the splash guard 7 is tightly connected with the outer side-wall 13. The splash-guard 7 is arranged between the top cover 12 and the duct 8. A slot-shaped annular opening 23, 25 is formed between the splash-guard 7 and outer periphery of the bottom plate 5.

On the gas-entry side of the bowl 3 a baffle 14 is tightly connected with the cover 12 on the baffle's upper edge and with the splash-guard 7 on the baffle's lower side. The baffle has the shape of a section of a cylinder. Furthermore two vertical separators 15 are tightly connected with the cover 12, with the splash-guard 7, and with the baffle 14. The baffle 14, the separators 15, the cover 12, the splash-guard 7, and the cylindrical side-wall 13 together enclose a gas distribution chamber 20, which has the shape of a section of a ring.

The gas distribution chamber 20 has gas entrance openings 19 in the cover 12 and gas transfer openings 21 in the splash-guard 7.

The splash-guard 7, the duct 8 and the cylindrical side-wall 13 together enclose a ring chamber 22, 26. The ring chamber comprises two sections a gas source chamber 22 and a gas collecting chamber 26. The gas source chamber 22 is in fluid connection to the gas distribution chamber 20 via the gas transfer openings 21. The gas collecting chamber 26 is in fluid connection to the first exhaust chamber 28 via the gas transfer openings 27 in the splash-guard.

The first exhaust chamber 28 is enclosed by the splash-guard 7, the cylindrical side-wall 13, and the cover 12. The first exhaust chamber 28 is open towards the interior of the bowl 3. However, in another embodiment it can be separated from the interior by a baffle similar to the baffle 14.

The first exhaust chamber 28 is in fluid connection to the second exhaust chamber 30 via a slot-shaped opening 29 in the cylindrical sidewall 7. The second exhaust chamber 30 is connected to the exhaust 32.

When exhaust is switched on (thereby providing negative pressure to second exhaust chamber 30) and the spin chuck 2 is in a position so that it merely closes the bowl 3 (thereby forming the interior chamber 24) the route of the gas flow indicated by arrows is as follows: ambient gas is introduced through gas entrance openings 19 into gas distribution chamber 20. There gas is evenly distributed to gas source chamber 22 through gas transfer openings 21. From gas source chamber 22 gas is feed into the interior chamber 24 through slot-shaped annular opening 23 and exits through slot-shaped annular opening 25 into gas collecting chamber 26. Thereby gas travels across the plate 5 merely parallel to the plate 5. A part of the gas will directly flow into the first exhaust chamber 28.

Droplets, which might adhere to plate 5 will be removed from the plate 5 and in any case will have no possibility to be drawn to the disc-like article W, which is held by the spin chuck 2 above the plate 5. Exhaust conditions shall be set so that a laminar flow is established over plate 5. Spinning of the disc-like article with the spin chuck interferes with flow conditions in interior chamber 24. Therefore it is understood that spin speed of the spin chuck is set low enough in order to keep laminar flow conditions.

Different media (liquid and/or gas) can be supplied to the disc-like article W through a first media supply M1 located near the centre of the plate and directed towards the disc-like article. A second media supply M2 is provided in the spin chuck near the centre of the spin chuck and directed towards.

Therefore a disc-like article (e.g. a semiconductor wafer) can be treated from both sides either simultaneously or alternatively. If the plate 5 is equipped with ultrasonic transducers (not shown) liquid is preferably supplied from both sides during ultrasonic treatment of the disc-like article.

In the following a typical process shall be described:

For receiving a wafer W the spin chuck 2 is elevated above the cover 12. An end effector (not shown) places the wafer onto the spin chuck 2 where it is securely held by gripping claws (pins). The spin chuck 2 is now lowered to a cleaning position (not shown) so that the disc-like article W is brought close to the plate 5 in a distance of about 2 mm. Cleaning liquid is now supplied to both gaps between the plate 5 and the disc-like article as well as between the spin-chuck and the disc-like article. During cleaning with the liquids ultrasonic energy is supplied to the disc-like article by transducers attached to plate 5. Thereafter cleaning liquids are displaced by rinsing liquids and the spin chuck is lifted to drying position (shown in FIG. 1). The drying position is selected in a distance of about 4 cm between the plate 5 and the wafer W, however the wafer W is still within the interior of the bowl. The wafer W thus held somewhat below the cover. The rinsing liquid in the gap between wafer and spin chuck is displaced by a drying gas through the second media supply M2.

On the lower side of the wafer a closed film of the rinsing liquid entirely covers the wafer. Now the liquid meniscus is displaced by a drying gas centrally applied to wafer from below through the first media supply M1. When the spin chuck is held in the drying position, air flows across the plate 5 parallel to the plate 5. Therefore droplets, which are eventually adhering to the plate 5, are not driven to the wafer but rather may leave the bowl through the exhaust.

The invention claimed is:

1. A device for liquid treatment of a disc-like article, comprising:
   a spin chuck for holding and rotating a disc-like article;
   dispensing means for dispensing liquid onto the disc-like article;
   liquid collecting means for collecting the liquid, which is flung off the disc-like article when the disc-like article is rotated;
   a plate arranged parallel to the disc-like article and facing the disc-like article when the disc-like article is held by the spin chuck; and
   gas-guide means for directing gas parallel to the plate across the plate from one circumferential edge of the plate to another circumferential edge of the plate,
   wherein the gas-guide means comprises an exhaust for collecting the gas and a gas source for providing the gas, the exhaust and gas source being arrange opposite to each other with respect to a symmetrical plane, which is perpendicular to a plane of the disc-like article when the disc-like article is rotated, and
   wherein the exhaust comprises an exhaust chamber having a shape of a first section of a ring chamber and the gas source comprises a gas source chamber having a shape of a second section of the ring chamber.

2. The device according to claim 1, wherein the first section of the ring chamber, and the second section of the ring chamber are connected to an area between the plate and the disc-like article via a slot shaped annular opening.

3. The device according to claim 2, wherein the first section of the ring chamber and the second section of the ring chamber are members of the same ring chamber.

4. The device according to claim 3, wherein the first section of the ring chamber and the second section of the ring chamber are separated from each other by a radial wall.

5. The device according to claim 1, wherein a splash guard is provided for directing the liquid, which is flung off the disc-like article when rotated, into an annular duct.

6. The device according to claim 1, further comprising a lifting mechanism that can alter the distance between the plate and the disc-like article.

7. A method for liquid treatment of a disc-like article, comprising:
   rotating a disc-like article;
   dispensing liquid onto the disc-like article when the disc-like article is rotated;
   collecting the liquid, which is flung off the disc-like when the disc-like article is rotated;
   providing a plate arranged parallel to the disc-like article and facing the disc-like article when the disc-like article is rotated; and
   directing gas parallel to the plate across the plate from one circumferential edge of the plate to another circumferential edge of the plate using gas-guide means,
   wherein the gas-guide means comprises an exhaust for collecting the gas and a gas source for providing the gas, the exhaust and gas source are arranged opposite each other with respect to a symmetric plane, which is perpendicular to a plane of the disc-like article when the disc-like article is rotated, and
   wherein the exhaust comprises an exhaust chamber having a shape of a first section of a ring chamber and the gas source comprises a gas source chamber having a shape of a second section of the ring chamber.

8. The method according to claim 7, wherein the disc-like article rotates at a speed of at least 10 rpm at least part of the time when the gas flows across the plate.

9. The method according to claim 7, wherein the disc-like article is held in a distance of at least 5 mm from the plate when the gas flows parallel to the plate across the plate.

* * * * *